(12) United States Patent
Voldman

(10) Patent No.: US 7,535,105 B2
(45) Date of Patent: May 19, 2009

(54) INTER-CHIP ESD PROTECTION STRUCTURE FOR HIGH SPEED AND HIGH FREQUENCY DEVICES

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/161,414

(22) Filed: Aug. 2, 2005

(65) Prior Publication Data

US 2007/0029646 A1    Feb. 8, 2007

(51) Int. Cl.
*H01L 39/00* (2006.01)
(52) U.S. Cl. ........................ 257/758; 361/111
(58) Field of Classification Search ................. 257/758; 361/111
See application file for complete search history.

(56) References Cited

U.S. PATENT DOCUMENTS

| | | | |
|---|---|---|---|
| 4,818,728 A * | 4/1989 | Rai et al. ................... 438/108 |
| 5,466,634 A * | 11/1995 | Beilstein et al. .............. 438/15 |
| 5,466,892 A * | 11/1995 | Howard et al. .............. 174/261 |
| 5,637,912 A | 6/1997 | Cockerill et al. |
| 5,703,747 A * | 12/1997 | Voldman et al. ............ 361/111 |
| 5,731,945 A | 3/1998 | Bertin et al. |
| 5,771,571 A | 6/1998 | Voldman et al. |
| 5,786,237 A | 7/1998 | Cockerill et al. |
| 5,807,791 A | 9/1998 | Bertin et al. |
| 5,930,098 A | 7/1999 | Voldman et al. |
| 5,943,254 A | 8/1999 | Bakeman, Jr. et al. |
| 5,945,713 A | 8/1999 | Voldman |
| 6,429,045 B1 | 8/2002 | Furukawa et al. |
| 2002/0106893 A1 | 8/2002 | Furukawa et al. |
| 2003/0067726 A1 | 4/2003 | Voldman |
| 2003/0089979 A1 | 5/2003 | Malinowski et al. |
| 2003/0100200 A1 * | 5/2003 | Franzon et al. ............... 439/66 |

\* cited by examiner

*Primary Examiner*—Thomas L Dickey
(74) *Attorney, Agent, or Firm*—Scully, Scott, Murphy & Presser, P.C.; Anthony J. Canale

(57) ABSTRACT

The present invention relates to inter-chip electrostatic discharge (ESD) protection structures for high speed, and high frequency devices that contain one or more direct, inter-chip signal transmission paths. Specifically, the present invention relates to a structure that contains: (1) a first chip including a first circuit, (2) a second chip including a second circuit, (3) an intermediate insulator layer located between the first and second chips, wherein the first and second circuits form a signal transmission path for transmitting signals through the intermediate insulator layer. An electrostatic discharge (ESD) protection path is provided in the structure between the first and the second chip through the intermediate insulator layer, to protect the signal transmission path from ESD damages.

19 Claims, 4 Drawing Sheets

INTER-CHIP ESD PROTECTION STRUCTURE FOR HIGH SPEED AND HIGH FREQUENCY DEVICES

FIELD OF THE INVENTION

This invention generally relates to protection of integrated circuit chips in multi-chip structures for high speed and high frequency applications. More specifically, the present invention relates to structures that protect the integrated circuit chips from electrostatic discharge (ESD) or other potentially damaging voltage transients, and methods for fabricating such structures.

BACKGROUND OF THE INVENTION

Transmission of signals between semiconductor chips is important for achieving system performance objectives. In wired communications, signals are transmitted by off-chip drivers (OCD) or circuits to a card, board, or substrate. In typical semiconductor designs, the signals are transmitted through signal pads, wire bonds (or solder balls), and metal interconnects to the card, board, or substrate. The signals are then received by a receiver network through the metal interconnects, wire bonds, and signal pads. In system designs, the time of flight, the capacitance loading, and the resistance can impact the system performance. As technology performance increases, the capacitance loading effect of these interconnects becomes performance impacting.

On all external pins (e.g. signal transmission pins, receiver pins, power pins), electrostatic discharge (ESD) networks are placed, in order to protect sensitive circuits. ESD is a phenomenon known to degrade or destroy discrete electronic components. In particular, given the decreasing size of circuit features with ever improving process technology, static electricity can destroy or substantially harm many of today's integrated circuits. Tribo-electric charges are produced anytime two surfaces are separated and if one or more of the surfaces is a nonconductor, then static electric charge is produced. This is a natural phenomenon and only causes a problem if the static charge is allowed to discharge or induce a charge into the integrated circuit. Such an ESD event can occur very persuasively to a point of several thousand volts. The discharge occurs very rapidly and the usual failure or degradation is caused by the gasification of metal within the device or the semiconductor material.

The damage following each electrostatic discharge event may be instantly catastrophic. Often times, however, the integrated circuit does not totally fail, but rather, remains operable within a latent defect that will ultimately result in premature failure. Such events can also alter the operating characteristics of the integrated circuit, thereby resulting in unsatisfactory and often unpredictable operation. Electrostatic discharge between input/output connects of a semiconductor device chip can occur, for example, from human handling, automated circuit testing or during packaging of discrete integrated circuit chips. To reduce the risk of handling, ESD protection circuits are placed on semiconductor chips' signal pins.

However, the conventional wired signal transmission systems do not allow direct chip-to-chip wireless signal transmissions. Instead, inter-chip signals must be transmitted electrically through the surface or edge wirings, which have relatively high capacitance loading, require expensive semiconductor processing, and are not suitable for high speed, high bandwidth, or high frequency applications.

Further, the ESD structures used in the conventional wired signal transmission systems typically contain ESD protection circuits or components that have significantly large footprints. Further, the ESD protection circuits on off-chip drivers (OCD) and receiver networks lead to additional capacitance loading, which adversely impacts the system performance. Therefore, the ESD structures in the conventional wired signal transmission systems impose a challenge for further scaling and hinders further improvement of system performance.

There is a continuing need for improved semiconductor structures that allow direct chip-to-chip wireless signal transmissions without surface or edge wirings and are suitable for use in high speed, high bandwidth, and/or high frequency applications.

SUMMARY OF THE INVENTION

In one aspect, the present invention relates to a structure that comprises:
a first chip including a first circuit;
a second chip including a second circuit;
an intermediate insulator layer located between the first and second chips, wherein the first and second circuits form a signal transmission path for transmitting signals through the intermediate insulator layer; and
an electrostatic discharge (ESD) protection path between the first and second chips through the intermediate insulator layer.

The signal transmitted between the first and second circuits are, for example, digital signals, radio-frequency (RF) signals, microwave signals, oscillating signals, etc.

Preferably, the ESD protection path is characterized by electrical impedance lower than that of the signal transmission path. In this manner, the ESD protection path protects the signal transmission path from ESD damages, by allowing electrical charge to transfer between the first and second chips through the ESD path, instead of through the intermediate insulator layer in the signal transmission path.

The ESD protection path may comprise any type of electrical coupling, including, but are not limited to: resistive coupling, capacitive coupling, inductive coupling, and combinations thereof. Preferably, the ESD protection path comprises a resistive coupling between the first chip and the second chip.

In a preferred but not necessary embodiment of the present invention, the ESD protection path contains a first conductor located in the first chip, a second conductor located in the second chip, and an interconnect located in the intermediate insulating layer for electrically connecting the first and second conductors. The interconnect may comprise any suitable material(s), such as metals, metal alloys, conductive polymers, and combinations thereof. Electrical resistance of such an interconnect is preferably less than that of the intermediate insulating layer.

The ESD protection path may be isolated from, and preferably parallel to, the signal transmission path. Alternatively, the ESD protection path may be coupled to the signal transmission path by any type of coupling that has little or no impact on the loading of the first and/or second circuits. For example, the ESD protection path may be coupled to the signal transmission path by a resistive coupling, a capacitive coupling, an inductive coupling, or combinations thereof.

Preferably, but not necessarily, the first circuit and the second circuit of the signal transmission path form an inter-chip capacitive coupling between the first and the second chips (i.e., the first circuit forms a first electrode of a capacitor, and the second circuit forms a second, opposite electrode of the capacitor). Such an inter-chip capacitive coupling is an unique feature of the present invention. It provides the ability to eliminate the need for wire-bonds, solder balls, vias, and wire interconnects, which in turn reduces the loading capacitance between the transmitter circuit on the first chip and the receiver circuit on the second chip. It further improves the system performance by lowering the "net" capacitance as well as lowering the voltage required for sensing smaller circuits.

In a preferred but not necessary embodiment of the present invention (which is to be illustrated in greater detail hereinafter), the first circuit in the first chip comprises a radio-frequency (RF) transmitter circuit, and the second circuit comprises an RF receiver circuit, which are arranged and constructed for transmitting RF signals through the intermediate insulator layer. More preferably, the RF transmitter and receiver circuits are aligned with each other, so as to provide an RF signal transmission path of relatively short length as defined by the thickness of the intermediate insulator layer. Such an RF signal transmission path is preferably protected by an ESD protection path that contains aligned conductors respectively located in the first and the second chips.

The ESD protection path of the present invention may be used solely for transferring electrical charge between the first and second chips to achieve a charge balance therebetween, thereby preventing ESD occurrence between the chips. Alternatively, the ESD protection may contain or be electrically connected to an ESD-resistant region, so that electric charge can be transferred from the first and/or second chip(s) to the ESD-resistant region. The ESD-resistant region may comprise, for example, a ground terminal or an ESD protection circuit.

In another aspect, the present invention relates to a structure comprising:

a first chip including a first substrate;

a second chip including a second substrate;

a signal path for communicatively coupling the first chip and the second chip; and another path having a first portion formed in the first chip and a second portion formed in the second chip for providing electrostatic discharge (ESD) protection for the signal path.

In yet another aspect, the present invention relates to a method for forming a structure, comprising:

forming a first chip having a first circuit and a first conductor located therein;

forming a second chip having a second circuit and a second conductor located therein;

forming an intermediate insulator layer over at least one of the first and second chips;

selectively removing a portion of the intermediate insulator layer to expose at least one of the first and second conductors;

forming an interconnect in the removed portion of the intermediate insulator layer; and attaching the first chip to the second chip so that the first and second circuits form a signal transmission path for transmitting signals through the intermediate insulator layer, and that the first conductor, the second conductor, and the interconnect form an electrostatic discharge (ESD) protection path between the first and second chips through the intermediate insulator layer.

Other aspects, features and advantages of the invention will be more fully apparent from the ensuing disclosure and appended claims.

DETAILED DESCRIPTION OF THE INVENTION AND PREFERRED EMBODIMENTS THEREOF

The present invention provides a semiconductor structure that is suitable for high speed, high bandwidth, and/or high frequency applications, such as RF or digital signal transmissions. The semiconductor structure of the present invention provides direct, chip-to-chip wireless signal coupling. More importantly, the semiconductor structure contains simplified ESD protection structures with significantly reduced footprints. Such ESD protection structures solve the charging problem in inter-chip signal transmission network and can be readily scaled according to specific application requirements.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
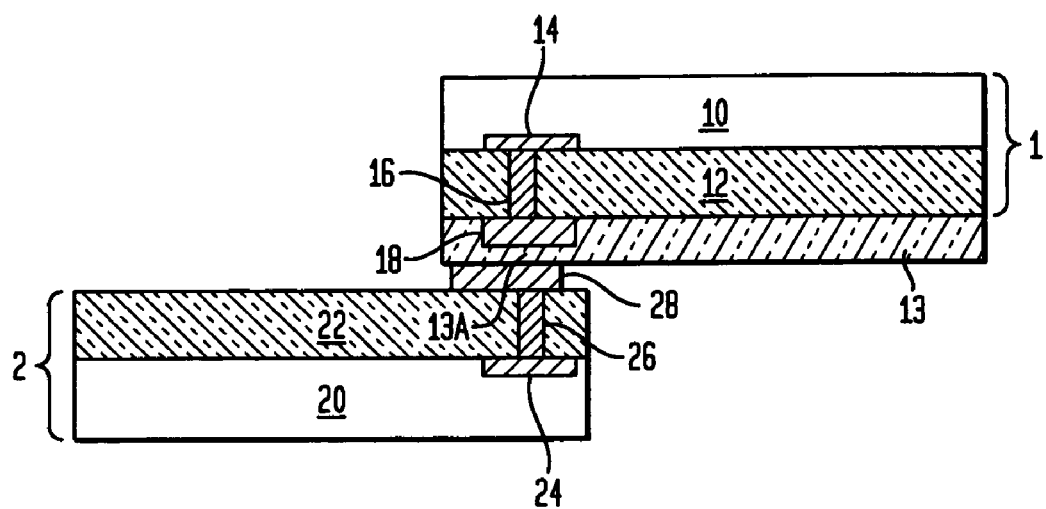
FIGS. 1A-1C shows an exemplary semiconductor structure, which contains a first chip with a RF transmitter circuit and a second chip with a RF receiver circuit arranged for inter-chip RF signal transmission and which is vulnerable to inter-chip ESD occurrence.

FIG. 1A shows an inter-chip receiver/transmitter network, in which a receiver circuit 14 is provided in a surface (i.e., the front surface) of the substrate 10 of a first integrated circuit (hereinafter "chip") 1, and a transmitter circuit 24 is provided in a surface (i.e., the front surface) of the substrate 20 of a second chip 2. The other surfaces of the substrates 10 and 20, opposite to their respective circuit-containing front surfaces, are hereby referred to as the back surfaces of the substrates 10 and 20. Various additional electrical components (not shown) may be fabricated in the front surfaces of the substrates 10 and 20 via the well-known front-end-of-line (FEOL) processes, and one or more intermediate layers of metal interconnects and inter-layer dielectrics (not shown) may be form over the front surfaces of the substrates 10 and 20 via the well-known back-end-of-line (BEOL) processes. The last inter-layer dielectric (ILD) layer formed over the front surface of the substrate 10 of the first chip 1 is shown in FIG. 1A as the ILD layer 12, and the last ILD layer formed over the front surface of the substrate 20 of the second chip 2 is shown in FIG. 1A as the ILD layer 22. Both the receiver and transmission circuits 14 and 24 are respectively connected by metal vias 16 and 26 to exposed metal pads or contacts 18 and 28 on the ILD layers 12 and 22 of the first and second chips 1 and 2. For simplicity, only one metal pad is shown for each circuit in FIG. 1A, but it is understood that each circuit is typically connected to multiple metal pads or contacts on the back surface of the chip.

One or more thin insulating films, which may contain silicon oxide, silicon nitride, or any other suitable dielectric material, or the combinations thereof, can be formed over either or both of the ILD layers 12 and 22, so as to cover either or both of the exposed metal pads 18 and 28. Although only one insulating film 13 is shown in FIG. 1A, it is understood herein that two or more insulating films may be provided over either or both of the ILD layers 12 and 22.

The first and second chips 1 and 2 are then stacked together, with the front circuit-containing surfaces of substrates 10 and 20 facing each other, to form a multi-chip structure, as shown in FIG. 1A. In this manner, the receiver and transmitter circuits 14 and 24 contained in the front surfaces of substrates 10 and 20 form a capacitive coupling through their respective metal pads 18 and 28, while a portion of the intermediate insulating film 13 between such metal pads 18 and 28 forms a capacitor dielectric layer 13A.

Such arrangement of the chips 1 and 2 allows direct chip-to-chip wireless signal transmission between the receiver and transmitter circuits 14 and 24 through the intermediate insulating film 13 or 13A and is particularly suitable for high speed, high bandwidth, and/or high frequency applications. Moreover, no surface or edge wirings are required, which significantly reduces the capacitance loading between chips 1 and 2.

In contrast, U.S. Pat. No. 6,429,045 issued on Aug. 6, 2002 describes a semiconductor device that contains multiple coplanar integrated circuit chips that are attached to a common silicon supporting substrate. The integrated circuit chips are electrically coupled to one another by high-density wirings formed over the front surfaces of the chips, and an electrically conductive path is further provided at the back surfaces of the chips for protecting the chips against ESD damages. U.S. Pat. No. 5,930,098 issued on Jul. 27, 1999 describes a semiconductor structure that contains multiple semiconductor device chips stacked together in a "head-to-tail" manner, i.e., with the front surface of one chip facing the back surface of the adjacent chip. Insulating films are provided between chips for the purpose of bonding and electrically isolating such chips. A metallization pattern is provided on one or more edge surface of the semiconductor structure, which provides edge wirings for electrically connecting the chips to one another and to external circuitry. An inter-chip ESD suppression network is also provided through the edge wirings for suppressing ESD events between chips.

The device or structure described by U.S. Pat. No. 6,429,045 or U.S. Pat. No. 5,930,098 does not provide for direct chip-to-chip signal transmission through the intermediate insulating layers between the chips. Instead, signal transmission in the device or structure of U.S. Pat. No. 6,429,045 or U.S. Pat. No. 5,930,098 is achieved by electrical current flowing through the surface or edge wirings, which have relatively high capacitance loading, require expensive semiconductor processing, and are not suitable for high speed, high bandwidth, or high frequency applications.

Further, the first and second chips 1 and 2 may be stacked either in an aligned manner, or in an offset manner with an overlapping region therebetween, as shown in FIG. 1A.

Figure 1B:
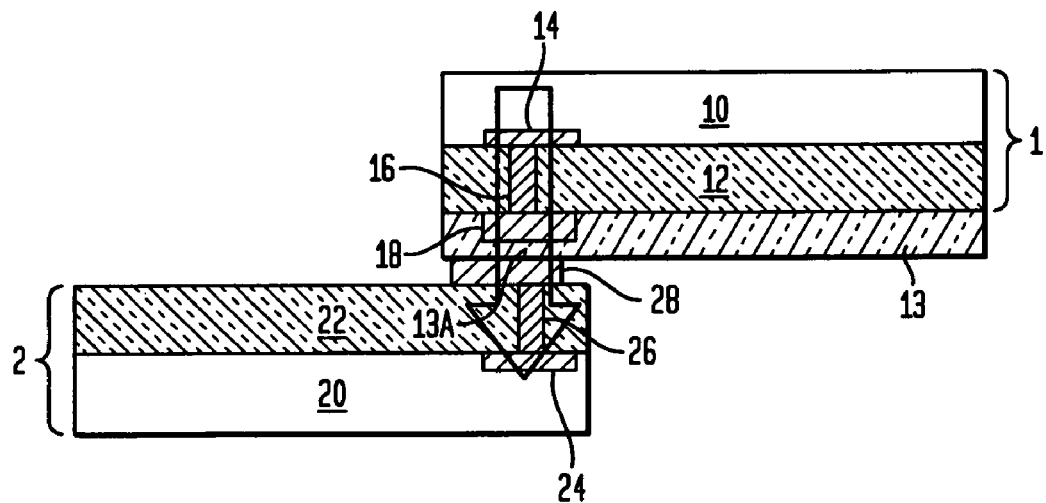
Figure 1C:
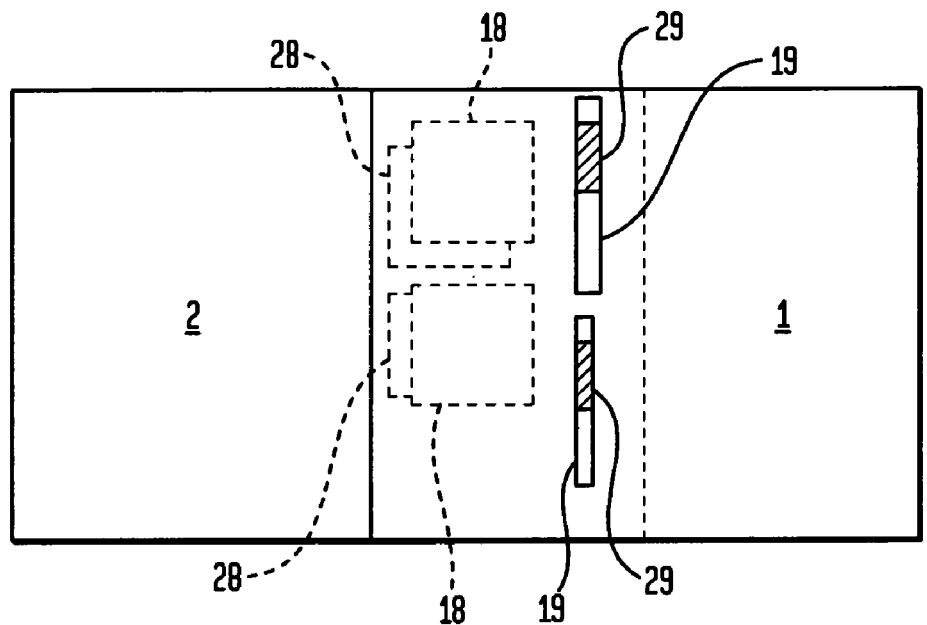

FIG. 1C is another view of the structure of FIG. 1A, in which the overlapping receiver and transmitter pads 18 and 28 and the respective substrate ground (Vss) supply or power (Vdd) supply 19 and 29 for both chips 1 and 2 are illustrated.

The inter-chip capacitive coupling as shown in FIG. 1A can be significantly limited by its vulnerability to ESD damages. For instance, charge can accumulate on any of the two chips 1 and 2, both during and after manufacturing, resulting in charge differential between the two chips 1 and 2. When the charge differential reaches a threshold, it can break the insulation provided by the thin film 13 or 13A and lead to an ESD event between the two chips 1 and 2, as shown by the arrowhead in FIG. 1B, causing insulator cracking and destruction of the inter-chip capacitive coupling.

The present invention therefore provides a solution for the ESD problem associated with direct inter-chip communication or coupling, by forming an inter-chip ESD protection path through the intermediate insulating film 13 or 13A. Electrical charge can be transferred between chips 1 and 2 through such an ESD protection path to achieve a charge balance, or can be transferred from chips 1 and/or 2 to a region that is less vulnerable to ESD damages, such as a ground terminal or an ESD circuit.

Figure 2:
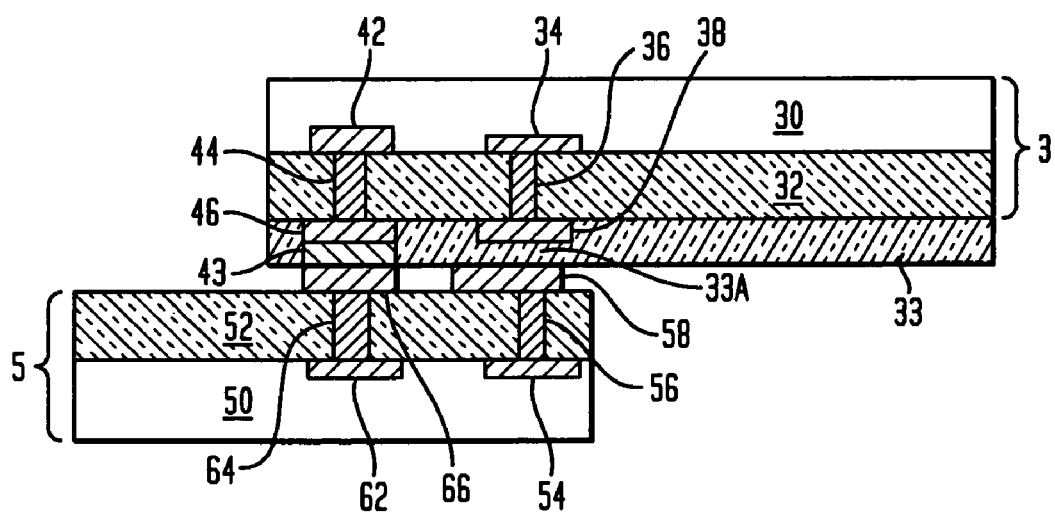
FIG. 2 shows a cross-sectional view of an exemplary semiconductor structure having an ESD protection path, according to one embodiment of the present invention.

Specifically, FIG. 2 shows a multi-chip structure, which contains a first chip 3 and a second chip 5 abutted against each other with a thin insulating film 33 therebetween. The first chip 3 contains a substrate 30 having a receiver circuit 34 located in its front surface, which is in turn connected to exposed metal pad 38 on the ILD layer 32 through metal via 36. The second chip 5 contains a substrate 50 having a transmitter circuit 54 located in its front surface, which is connected to exposed metal pad 58 on the ILD layer 52 through metal via 56. The receiver/transmitter circuits 34 and 54, metal vias 36 and 56, and metal pads 38 and 58 are aligned to form a signal transmission path for direct inter-chip signal transmission through the portion 33A of the insulating film 33 between the metal pads 38 and 58.

Further, in chip 3, a first conductor 42 is provided in the front surface of the substrate 30 and is connected to exposed metal pad 46 on the ILD layer 32 through metal via 44. Likewise, in chip 5, a second conductor 62 is provided in the front surface of the substrate 50 and is connected to exposed metal pad 66 on the ILD layer 52 through metal via 64. The metal pads 46 and 66 are electrically coupled by a metal interconnect 43 in the insulating film 33. In this manner, the conductors 42 and 62, the metal vias 44 and 64, the metal pads 46 and 66, and the interconnect 43 are aligned to form a second path between chips 3 and 5, in addition to the signal transmission path formed by receiver/transmitter circuits 34 and 54, metal vias 36 and 56, and metal pads 38 and 58.

Such a second path protects the signal transmission path from ESD damages, by providing an electrical conduction or coupling between chips 3 and 5, thereby allowing electrical charge to pass therethrough between chips 3 and 5.

The metal pads 46 and 66 can be coupled by the metal interconnect 43, as shown in FIG. 2, and they alternatively can be coupled by interconnects formed of any suitable material (s), such as conductive polymers or semiconductors, provided that the interconnect has an electrical resistance less than that of the insulating film 33. For example, in FIG. 3, an interconnect 53 formed of conductive polymer is provided for coupling the metal pads 46 and 66.

Figure 3:
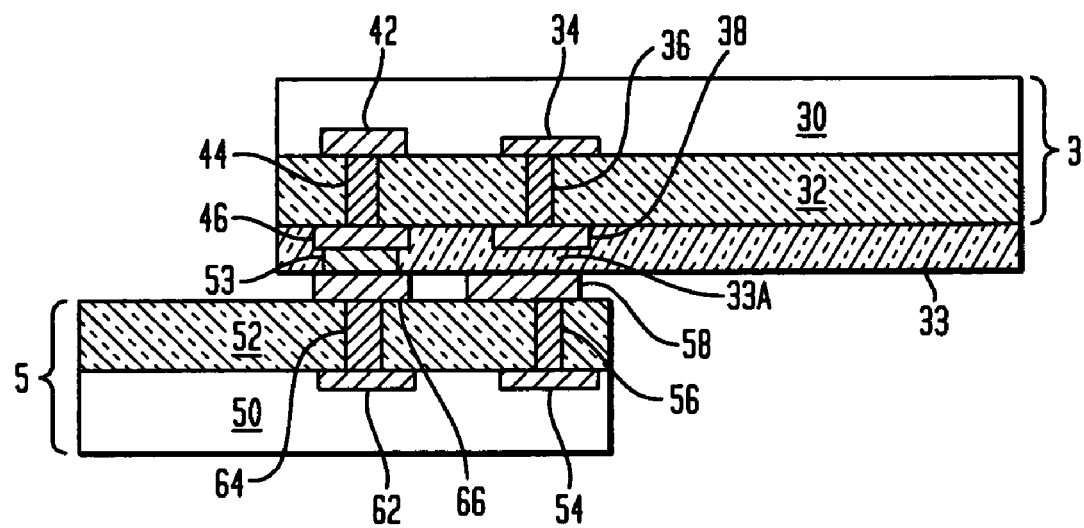
FIG. 3 shows a cross-sectional view of an exemplary semiconductor structure containing an ESD protection path with an interconnect formed of a conductive polymer, according to one embodiment of the present invention.

The ESD protection path shown in FIGS. 2 and 3 functions to achieve electrical charge balance between chips 3 and 5, which is suitable for use when chips 3 and 5 are to be maintained at substantially the same voltage. ESD protection path between chips of similar voltages can further comprise components such as resistors, diodes, etc. Alternatively, when chips 3 and 5 are designed to be maintained at different voltages, the ESD protection path may contain component(s) such as transistors, capacitors, inductors, etc., as long as the ESD protection path has electrical impedance that is less than the electrical impedance of the signal transmission path, which allows electrostatic charge to be released therethrough, instead of through the signal transmission path.

Figure 4:
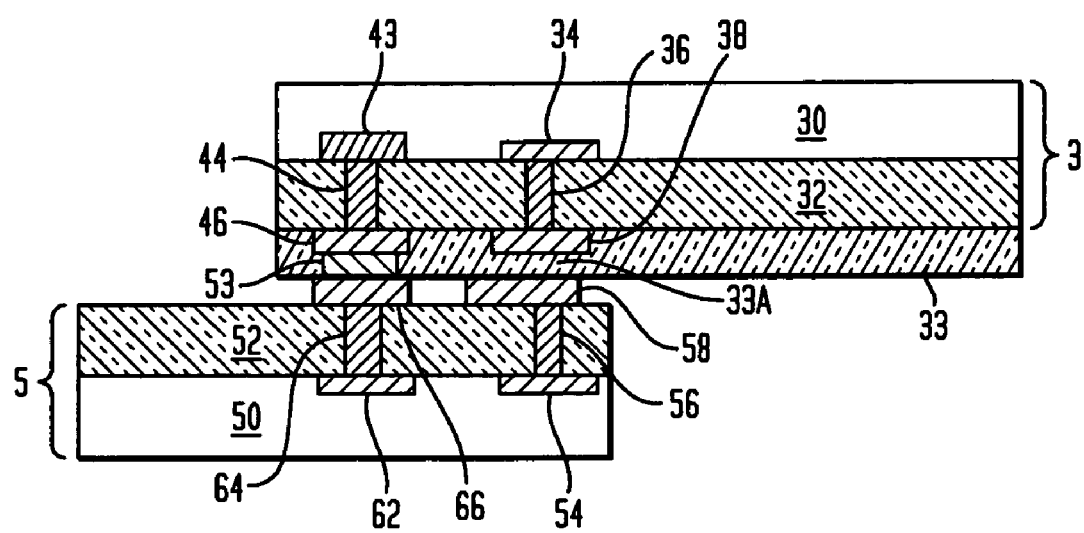
FIG. 4 shows a cross-sectional view of an exemplary semiconductor structure containing an ESD protection path that has an ESD protection circuit, according to one embodiment of the present invention.

Further, the ESD protection path of the present invention may contain or be connected to an ESD resistant region, so that electrostatic charge accumulated on chips 3 and/or 5 can be readily released to such an ESD resistant region. For example, the ESD resistant region may contain a ground terminal to which the electrostatic charge can be released. For another example, the ESD resistant region may contain an ESD protection circuit, which comprises one or more components such as spark gaps, field emission devices, diodes, and gated diodes. A spark gap generally discharges electrostatic energy across an air gap, and a field emission device can discharge not only across an air gap, but also across a gap filled with other gases or even a solid material, such as an insulator. FIG. 4 illustratively shows an ESD protection path that contains an ESD protection circuit 43 located in the front surface of the substrate 30 of the first chip 3, which can discharge electrostatic energy that comes directly from chip 3 or that comes from chip 5 through the conductor 62, the metal vias 64 and 44, the metal pads 66 and 46, and the conductive polymer interconnect 53. It is noted that the location of the ESD protection circuit 43 can be readily modified by a person ordinarily skilled in the art, consistent with the principles of the present invention described hereinabove. For example, the ESD protection circuit 43 may be located in chip 5, or between chips 3 and 5, or external to chips 3 and 5.

Figure 5:
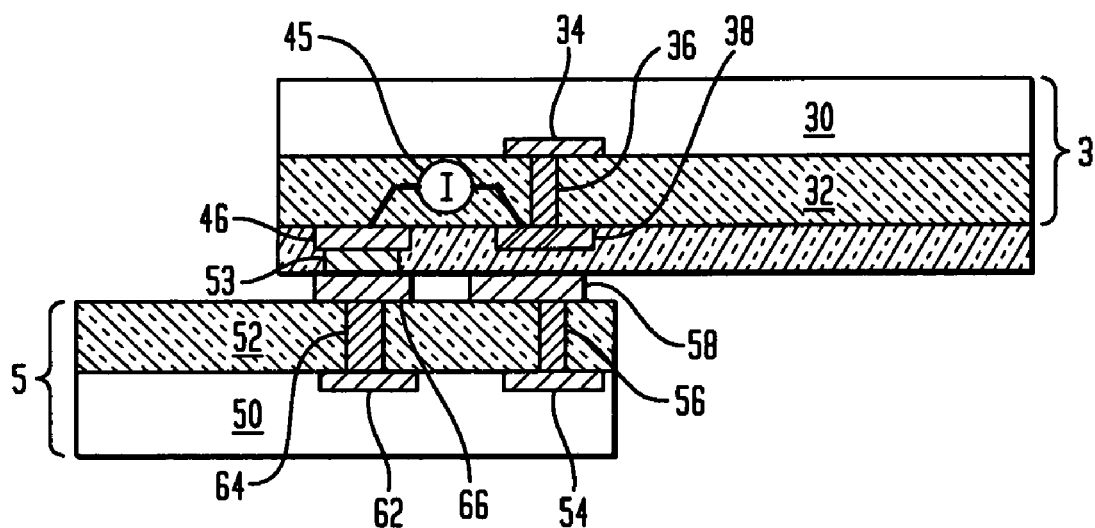
FIG. 5 shows a cross-sectional view of an exemplary semiconductor structure containing an ESD protection path that is inductively coupled with an RF signal transmission path, according to one embodiment of the present invention.
Figure 6:
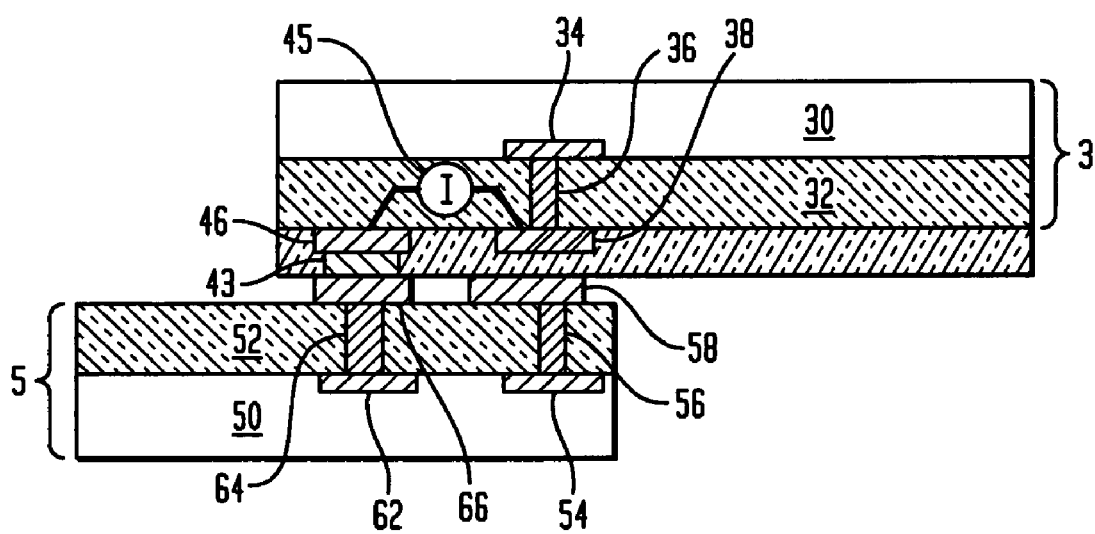
FIG. 6 shows a cross-section view of an exemplary semiconductor structure containing an ESD protection path that has an interconnect formed of a conductive polymer and is inductively coupled with an RF signal transmission path, according to one embodiment of the present invention.

The ESD protection path of the present invention can be arranged in parallel to the signal transmission path, without any direct connection therebetween, as shown in FIGS. 2-4, or it can be coupled to the signal transmission path via a resistor, capacitor, transistor, inductor, etc., as long as it is characterized by electrical impedance less than that of the signal transmission path. For example, FIGS. 5 and 6 illustratively shows an ESD protection path formed of metal pads 46 and 62, metal via 64, and an interconnect 53 or 43 formed of either a conductive polymer or a metal or metal alloy. The metal pad 46 is located in the ILD layer 32 of chip 3 and is inductively coupled to the receiver metal pad 38 by an inductor 45.

The ESD protection path of the present invention solves the ESD problem associated with direct inter-chip communication or signal transmission, increases the ESD resistance of multi-chip semiconductor structures, and allows usage of such multi-chip structures in high speed, high bandwidth, and/or high frequency applications. Further, the inter-chip ESD protection path of the present invention has significantly reduced footprints, in comparison with conventional ESD circuitry, and can be readily adapted for scaling according to specific application requirements.

The ESD protection path of the present invention can be fabricated by existing processing steps commonly used in integrated circuitry fabrication. For example, the conductors, the metal vias, and the metal pads in the ESD protection path can be fabricated simultaneously with the receiver/transmitter circuits, the metal vias, and the metal pads of the receiver/transmitter network. After formation of one or more insulating films over the exposed metal pads on the front surface(s) of either chip or both chips, a portion of the insulating film(s) over the metal pads in the ESD protection path can be selectively removed to expose the metal pads in the ESD protection path. A metal, metal alloy, semiconductor, or conductive polymer can then be deposited over the exposed metal pads in the ESD protection path and planarized to form an interconnect in the insulating film for connecting the exposed metal pads in the ESD protection path.

It is important to note that the structures as shown in FIGS. 1-6 can readily be modified by a person ordinarily skilled in the art, consistent with the description provided hereinabove, and such modifications are to be regarded as being within the spirit and scope of the invention.

For example, although the structures in FIGS. 1-6 each contains only one signal transmission path and one ESD protection path across two chips for illustration purpose, it is understood that any number of signal transmission paths and any number of multiple ESD protection paths across any number of chips can be provided consistent with the description provided hereinabove, to provide ESD-resistant direct inter-chip communications.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A structure comprising:
  a first chip including a first circuit and a first metal pad abutting a front surface of a first inter-layer dielectric layer thereupon;
  a second chip including a second circuit and a second metal pad abutting a front surface of a second inter-layer dielectric layer thereupon;
  an intermediate insulator layer consisting of silicon oxide, silicon nitride, or a combination thereof and abutting front surfaces of said first and second inter-layer dielectric layers, wherein the first and second circuits and said intermediate insulator layer form a chip-to-chip wireless signal transmission path for transmitting signals through said intermediate insulator layer through inter-chip capacitive coupling;
  a conductive interconnect embedded in said intermediate layer and vertically abutting said first metal pad and said second metal pad; and
  an electrostatic discharge (ESD) protection path between the first and second chips through said intermediate insulator layer and including said conductive interconnect, said first metal pad, and said second metal pad.

2. The structure of claim 1, wherein the signals are selected from the group consisting of digital signals, radio-frequency (RF) signals, microwave signals, oscillating signals, and combinations thereof.

3. The structure of claim 1, wherein the ESD protection path has electrical impedance that is lower than that of the signal transmission path.

4. The structure of claim 1, wherein the ESD protection path comprises a resistive coupling, a capacitive coupling, an inductive coupling, or combinations thereof.

5. The structure of claim 1, wherein said ESD protection path comprises:
   a first conductor located in the first chip; and
   a second conductor located in the second chip.

6. The structure of claim 5, wherein said interconnect comprises material selected from the group consisting of metals, metal alloys, semiconductors, conductive polymers, and combinations thereof, and wherein said interconnect has an electrical resistance less than that of the intermediate insulating layer.

7. The structure of claim 1, wherein the ESD protection path is isolated from and parallel to the signal transmission path.

8. The structure of claim 1, wherein the ESD protection path is coupled to the signal transmission path by a resistive coupling, a capacitive coupling, an inductive coupling, or combinations thereof.

9. The structure of claim 1, wherein said first and second circuits form a capacitive coupling.

10. The structure of claim 1, wherein the first circuit comprises an RF transmitter circuit, and wherein the second circuit comprises an RF receiver circuit, and wherein said RF transmitter and receiver circuits are arranged and constructed for transmitting RF signals through the intermediate insulator layer.

11. The structure of claim 10, wherein said RF transmitter and receiver circuits are aligned with each other.

12. The structure of claim 11, wherein said ESD protection path comprises a first conductor located in the first chip, a second conductor located in the second chip, and an interconnect between said first conductor and said second conductor.

13. The structure of claim 12, wherein said first and second conductors are aligned with each other.

14. The structure of claim 1, wherein at least a portion of said ESD protection path contains or is electrically coupled to an ESD-resistant region for transferring electrical charge from at least one of the first and second chips to said ESD-resistant region.

15. The structure of claim 14, wherein said ESD-resistant region comprises a ground terminal.

16. The structure of claim 14, wherein said ESD-resistant region comprises at least one ESD protection circuit.

17. The structure of claim 16, wherein said at least one ESD protection circuit comprises component(s) selected from the group consisting of spark gaps, field emission devices diodes and gated diodes.

18. The structure of claim 1, wherein said first and second chips each comprises a front surface and a back surface, wherein the first and second circuits are respectively located in the front surfaces of the first and second chips, and wherein the front surface of the first chip contacts a first surface of the intermediate insulator layer and the front surface of the second chip contacts a second, opposite surface of the intermediate insulator layer.

19. A structure comprising:
   a first chip including a first substrate and a first metal pad abutting a front surface of a first inter-layer dielectric layer thereupon;
   a second chip including a second substrate and a second metal pad abutting a front surface of a second inter-layer dielectric layer thereupon;
   a signal path for communicatively coupling said first chip and said second chip through an intermediate insulator layer consisting of silicon oxide, silicon nitride, or a combination thereof and abutting front surfaces of said first and second inter-layer dielectric layers, wherein said first chip, said intermediate layer, and said second chip comprises a signal path, wherein said communicative coupling is an inter-chip capacitive coupling providing a chip-to-chip wireless signal transmission path;
   a conductive interconnect embedded in said intermediate layer and vertically abutting said first metal pad and said second metal pad; and
   another path having a first portion formed in said first chip and a second portion formed in said second chip for providing electrostatic discharge (ESD) protection for said signal path and including said conductive interconnect, said first metal pad, and said second metal pad.

* * * * *